(12) United States Patent
Forbes

(10) Patent No.: US 7,480,185 B2
(45) Date of Patent: Jan. 20, 2009

(54) BALLISTIC INJECTION NROM FLASH MEMORY

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 104 days.

(21) Appl. No.: 11/691,603

(22) Filed: Mar. 27, 2007

(65) Prior Publication Data

US 2007/0187747 A1 Aug. 16, 2007

Related U.S. Application Data

(63) Continuation of application No. 10/847,840, filed on May 18, 2004, now Pat. No. 7,196,935.

(51) Int. Cl.
*G11C 16/04* (2006.01)
(52) U.S. Cl. .............. 365/185.27; 365/27; 365/182; 365/162
(58) Field of Classification Search .......... 365/27, 365/185.27, 182, 162
See application file for complete search history.

(56) References Cited

U.S. PATENT DOCUMENTS

| | | |
|---|---|---|
| 5,930,634 A | 7/1999 | Hause et al. |
| 5,969,383 A | 10/1999 | Chang et al. |
| 6,046,086 A * | 4/2000 | Lin et al. ............ 438/264 |
| 6,133,098 A | 10/2000 | Ogura et al. |
| 6,248,633 B1 | 6/2001 | Ogura et al. |
| 6,359,807 B1 | 3/2002 | Ogura et al. |
| 6,366,500 B1 | 4/2002 | Ogura et al. |
| 6,406,945 B1 | 6/2002 | Lee et al. |
| 6,518,126 B2 | 2/2003 | Wu et al. |
| 6,542,412 B2 | 4/2003 | Ogura et al. |
| 6,580,641 B2 | 6/2003 | Wu et al. |
| 6,709,934 B2 | 3/2004 | Lee et al. |
| 6,891,751 B2 | 5/2005 | Mikolajick |
| 6,897,517 B2 | 5/2005 | Van Houdt et al. |
| 2002/0045319 A1 | 4/2002 | Ogura et al. |
| 2004/0057283 A1 | 3/2004 | Cernea |

(Continued)

OTHER PUBLICATIONS

P. Pavan, et al. "Flash Memory Cells-An Overview" Proceedings of the IEEE, vol. 85, No. 8, Aug. 1997 pp. 1248-1271.

(Continued)

*Primary Examiner*—Thong Q Le
(74) *Attorney, Agent, or Firm*—Leffert Jay & Polglaze, P.A.

(57) ABSTRACT

A split NROM flash memory cell is comprised of source/drain regions in a substrate. The split nitride charge storage regions are insulated from the substrate by a first layer of oxide material and from a control gate by a second layer of oxide material. The nitride storage regions are isolated from each other by a depression in the control gate. In a vertical embodiment, the split nitride storage regions are separated by an oxide pillar. The cell is programmed by creating a positive charge on the nitride storage regions and biasing the drain region while grounding the source region. This creates a virtual source/drain region near the drain region such that the hot electrons are accelerated in the narrow pinched off region. The electrons become ballistic and are directly injected onto the nitride storage region that is adjacent to the pinched off channel region.

20 Claims, 6 Drawing Sheets

U.S. PATENT DOCUMENTS

2006/0124989 A1    6/2006    Forbes

OTHER PUBLICATIONS

D. Kim, et al. "A 2Gb NAND Flash Memory with 0.044 um² Cell Size using 90nm Flash Technology" IEEE IEDM, 2002, 4 pgs.

J. Choi, et al. "Highly Manufacturable 1 Gb NAND Flash Using 0.12 um Process Technology" IEEE IEDM, 2001, 4 pgs.

B. Eitan et al., "NROM: A Novel Localized Trapping, 2-Bit Nonvolatile Memory Cell," IEEE Electron Device Lett, vol. 21, No. 11, (Nov. 2000), pp. 543-545, Copyright 2000 IEEE.

E. Lusky, et al., "Characterization of Channel Hot Electron Injection by the Subthreshold Slope of NROM™ Device," IEEE Electron Device Lett., Vol. 22, No. 11, (Nov. 2001) pp. 556-558, Copyright 2001 IEEE.

E. Maayan et al., "A 512Mb NROM Flash Data Storage Memory with 8MB/s Data Rate" Dig. IEEE Int. Solid-State Circuits Conf., San Francisco, (Feb. 2002), pp. 1-8, Copyright Saifun Semiconductors Ltd. 2002.

Y. Shin, et al. "High Reliable SONOS-type NAND Flash Memory Cell with $Al_2O_3$ for Top Oxide" Technology Development Team, Samsung Electronics Co., Ltd., pp. 58-59.

S. Ogura, et al. "Low Voltage, Low Current, High Speed Program Step Gate Cell with Ballistic Direct Injection for EEPROM/Flash" Digest International Electron Devices Meeting, 1998, pp. 987-990.

T. Saito, et al. "Split Gate Cell with Phonon Assisted Ballistic CHE injection" VLSI Tech. Symp. Digest Technical Papers, 2000, pp. 126-127.

Y. Naveh, et al. "Modeling of 10nm-Scale Ballistic MOSFET'S" IEEE Electron Device Letters, vol. 21, No. 5, May 2000, pp. 242-244.

\* cited by examiner

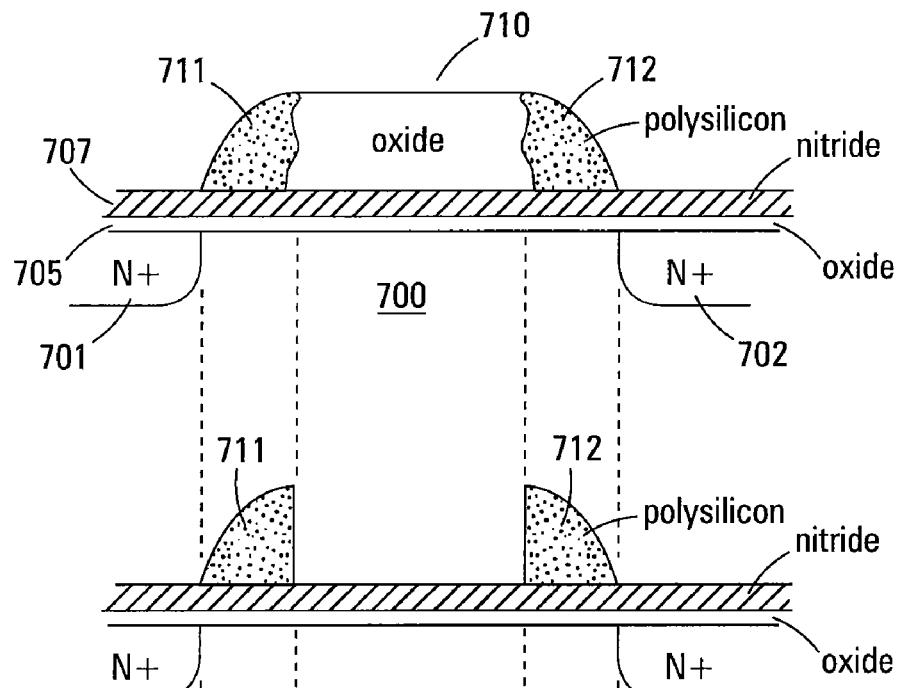
Fig. 7A
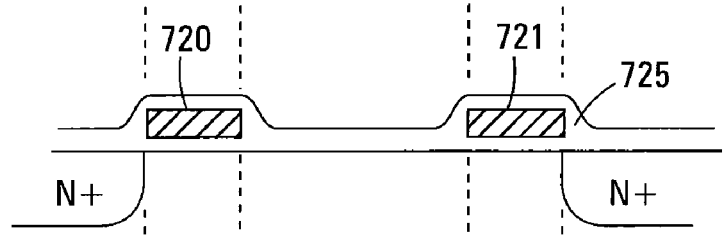
Fig. 7B
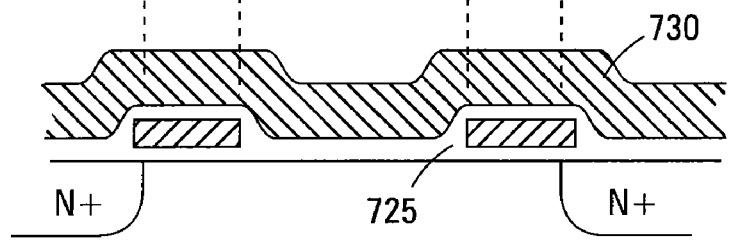
Fig. 7C
Fig. 7D

BALLISTIC INJECTION NROM FLASH MEMORY

RELATED APPLICATION

This Application is a Continuation of U.S. application Ser. No. 10/847,840, titled "BALLISTIC INJECTION NROM FLASH MEMORY," filed May 18, 2004 now U.S Pat No. 7,196,935, which is commonly assigned and incorporated herein by reference.

TECHNICAL FIELD OF THE INVENTION

The present invention relates generally to memory devices and in particular the present invention relates to nitride read only memory cells.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory. One type of flash memory is a nitride read only memory (NROM). NROM has some of the characteristics of flash memory but does not require the special fabrication processes of flash memory. NROM integrated circuits can be implemented using a standard CMOS process.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

The performance of flash memory transistors needs to increase as the performance of computer systems increases. To accomplish a performance increase, the transistors can be reduced in size. This has the effect of increased speed with decreased power requirements.

However, a problem with decreased flash memory size is that flash memory cell technologies have some scaling limitations due to the high voltage requirements for program and erase operations. As MOSFETs are scaled to deep sub-micron dimensions, it becomes more difficult to maintain an acceptable aspect ratio. Not only is the gate oxide thickness scaled to less than 10 nm as the channel length becomes sub-micron but the depletion region width and junction depth must be scaled to smaller dimensions. The depletion region or space charge width can be made smaller by increasing the substrate or well doping. However, it is extremely difficult to scale the junction depths to 100 nm-200 nm (1000 Å to 2000 Å) since these are doped by ion implantation and diffusion.

Another problem with flash memories is program speed. Depending on threshold voltage levels, programming times in tenths of a second or more is not uncommon.

For the reasons stated above, and for other reasons stated below which will become apparent to those skilled in the art upon reading and understanding the present specification, there is a need in the art for a more scalable, higher performance flash memory transistor.

BRIEF DESCRIPTION OF THE DRAWINGS

FIGS. 7A-7D show a cross-sectional view of one embodiment of a fabrication method of the present invention in accordance with the embodiment of FIG. 1.

DETAILED DESCRIPTION

Figure 1:
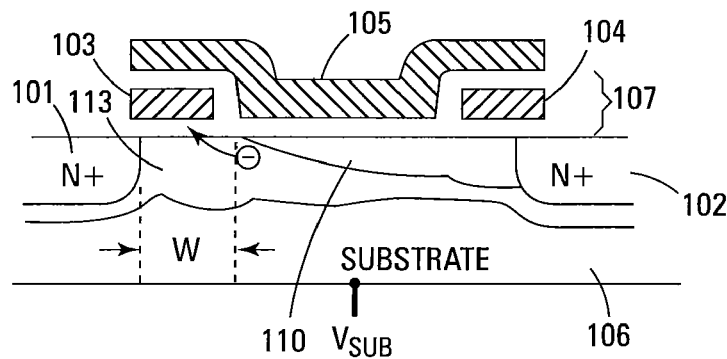
FIG. 1 shows a cross-sectional view of one embodiment of a planar split nitride layer NROM flash memory cell of the present invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a cross-sectional view of one embodiment of a planar split nitride layer NROM flash memory cell of the present invention. The cell is comprised of a substrate 106 that has two n+ doped regions 101 and 102 that act as source/drain regions. The function of the region 101 or 102 is determined by the direction of operation of the memory cell. In the embodiment of FIG. 1, the substrate 106 is a p-type material and the source/drain regions 101 and 102 are n-type material. However, alternate embodiments may have an n-type substrate with p-type source/drain regions.

A channel region 110 is formed between the source/drain regions 101 and 102. During a program operation, electrons are injected from a pinched off area of the channel region 110 to one of two nitride storage regions 103 or 104. The electrons flow in the opposite direction during an erase operation. The direction in which the transistor is operated determines which nitride storage region 103 or 104 is used.

The nitride storage regions 103 and 104, typically constructed utilizing a single level polysilicon process, are disposed over the channel region 110 in a gate insulator layer 107. In the embodiment shown in FIG. 1, the gate insulator 107 is formed in an oxide-nitride-oxide (ONO) composition 107. In alternative embodiments, the gate insulator 107 is selected from the group of silicon dioxide (SiO$_2$) formed by wet oxidation, silicon oxynitride (SON), silicon rich oxide (SRO), and silicon rich aluminum oxide (Al$_2$O$_3$).

In other embodiments, the gate insulator 107 is selected from the group of silicon rich aluminum oxide insulators, silicon rich oxides with inclusions of nanoparticles of silicon, silicon oxide insulators with inclusions of nanoparticles of silicon carbide, and silicon oxycarbide insulators. In still other embodiments, the gate insulator 107 includes a composite layer selected from the group of an oxide-aluminum oxide (Al$_2$O$_3$)-oxide composite layer, an oxide-silicon oxycarbide-oxide composite layer, and an oxide-nitride-aluminum oxide composite layer.

In still other embodiments, the gate insulator 107 includes a composite layer, or a non-stoichiometric single layer of two or more materials selected from the group of silicon (Si), titanium (Ti), and tantalum (Ta).

A control gate 105 is located over the gate insulator layer 107 and can be made of doped polysilicon. A depression portion of the control gate 105 electrically separates or "splits" the nitride storage regions 103 and 104 of the gate insulator 107 to create the two charge storage areas 103 and 104.

In operation, the memory cell of the present invention employs ballistic direction injection to perform a programming operation. The ballistic direction injection provides lower write times and currents.

The ballistic direction injection is accomplished by initially over-erasing the cell. This may be done during a functional test. The over-erase operation leaves the nitride storage regions 103 and 104 with an absence of electrons (i.e., in a positive charge state) and creating a "virtual" source/drain region 113 near the source/drains regions 101 and 102. The virtual source/drain region 113 has a lower threshold voltage than the central part of the channel 110 and is either an ultra thin sheet of electrons or a depleted region with a low energy or potential well for electrons.

When the transistor is turned on with an applied drain voltage, a variation in potential energy is created along the surface of the semiconductor, as will be illustrated later with reference to FIG. 4. A potential well or minimum for electrons exists due to the positive charge on the nitride storage regions 103 and 104. When the transistor is turned on, these potential energy minimums for electrons cause a higher density of electrons near the source. Thus the channel pinches off further away 113 from the drain 101 than normal. The length of the pinched-off region 113 is determined by the length of the nitride storage regions that have sub-lithographic minimal dimensions. Hot electrons accelerated in the narrow region 113 near the drain 101 become ballistic and are directly injected onto the nitride storage region 103.

In one embodiment, this pinched-off region 113 is in a range of 10-40 nm (100-400 Å). Alternate embodiments have different ranges depending on the nitride storage region length.

The NROM transistor of the present invention is symmetrical and can be operated in either direction to create two possible storage regions when operated in a virtual ground array. Therefore, the above operation description can be applied to the operation of the transistor when the remaining source/drain region 102 is biased such that it operates as a drain region.

In one embodiment, a substrate or well voltage, V$_{sub}$, is used to assist during a program operation. The substrate bias enables the nitride storage regions 103 and 104 to store injected electrons in excess of those that would be stored without the substrate bias. Without the bias, the programming process is self-limiting in that when enough electrons have been collected on a nitride storage region 103 or 104, that region 103 or 104 tends to repel any further electrons. The substrate bias results in a significant negative charge to be written to the nitride storage region 103 or 104. The substrate bias is not required for proper operation of the embodiments of the present invention.

In one embodiment, the substrate bias is a negative voltage in a range of −1 V to −2 V. Alternate embodiments use other voltages or voltage ranges.

Figure 2:
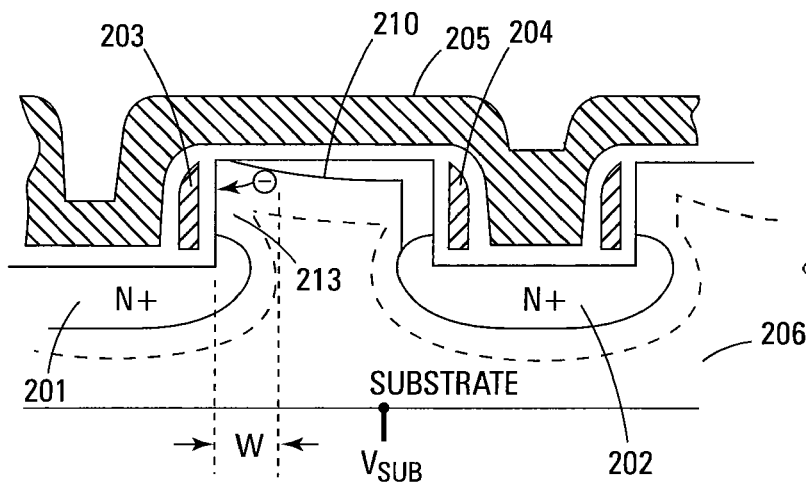
FIG. 2 shows a cross-sectional view of one embodiment of a vertical split nitride layer NROM flash memory cell of the present invention.

FIG. 2 illustrates a cross-sectional view of one embodiment of a vertical nitride layer NROM flash memory cell of the present invention. The transistor is comprised of a substrate 206 that includes a plurality of doped regions 201 and 202 that act as source/drain regions. In one embodiment, the substrate is a p-type material and the doped regions are n-type material. Alternate embodiments use an n-type substrate with opposite type doped regions 201 and 202.

The substrate forms a pillar between two nitride storage regions 203 and 204. This provides electrical isolation of the nitride storage regions 203 and 204. A control gate 205 is formed over the nitride storage regions 203 and 204 and substrate pillar.

A channel region 210 is formed between the nitride storage regions 203 and 204. Additionally, as in the planar embodiment of FIG. 1, a virtual source/drain region 220 is formed by an over-erase operation leaving the nitride storage regions 203 and 204 with an absence of electrons (i.e., in a positive charge state). However, in the vertical split nitride layer embodiment, the virtual source/drain region 213 and channel region 210 are two-dimensional in that they wrap around the corners of the substrate pedestal.

The operation of the vertical split nitride layer transistor embodiment of FIG. 2 is substantially similar to the operation described above for the planar embodiment. A drain bias is applied to one of the source/drain regions 201 or 202 that causes the channel region 210 nearest the drain to pinch off 213 further away from the drain 201 than normal. Hot electrons accelerated in the narrow region 213 near the drain 201 become ballistic and are directly injected onto a nitride storage region 203. The embodiment of FIG. 2 is also symmetrical and can be operated in either direction such that two nitride storage regions 203 or 204 are possible when operated in a virtual ground array.

In one embodiment, a substrate or well voltage, V$_{sub}$, is used to assist during a program operation. The substrate bias enables the nitride storage regions to store injected electrons in excess of those that would be stored without the substrate bias. In one embodiment, the substrate bias is a negative voltage in a range of −1 to −2 V. Alternate embodiments use other voltages. The substrate bias is not required for proper operation of the embodiments of the present invention.

Ballistic direction injection is easiest to achieve in a device structure where part of the channel is vertical as illustrated in the embodiment of FIG. 2. Lower write current and times are used since the geometry is conducive to hot electrons being accelerated by the electric fields. Hot electrons coming off of the pinched off end of the channel can be injected onto the nitride storage regions without undergoing any collisions with the atoms in the lattice.

Figure 3:
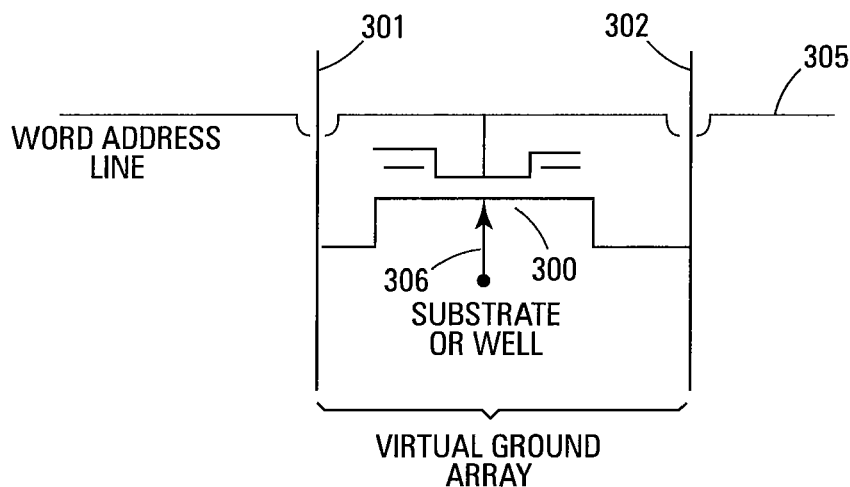
FIG. 3 shows an electrical schematic view of the embodiments of FIGS. 1 and 2.

FIG. 3 illustrates an electrical schematic view of both the planar and vertical split nitride layer NROM embodiments described in FIGS. 1 and 2. The memory cell symbol shows the transistor 300 with the substrate or well bias 306. The virtual ground array is the bit/data lines 301 and 302. These are illustrated in FIGS. 1 and 2 as the source/drain regions 101, 102, 201, and 202, respectively. The word address line 305 is illustrated in FIGS. 1 and 2 as the control gate 105 and 205, respectively.

Figure 4:
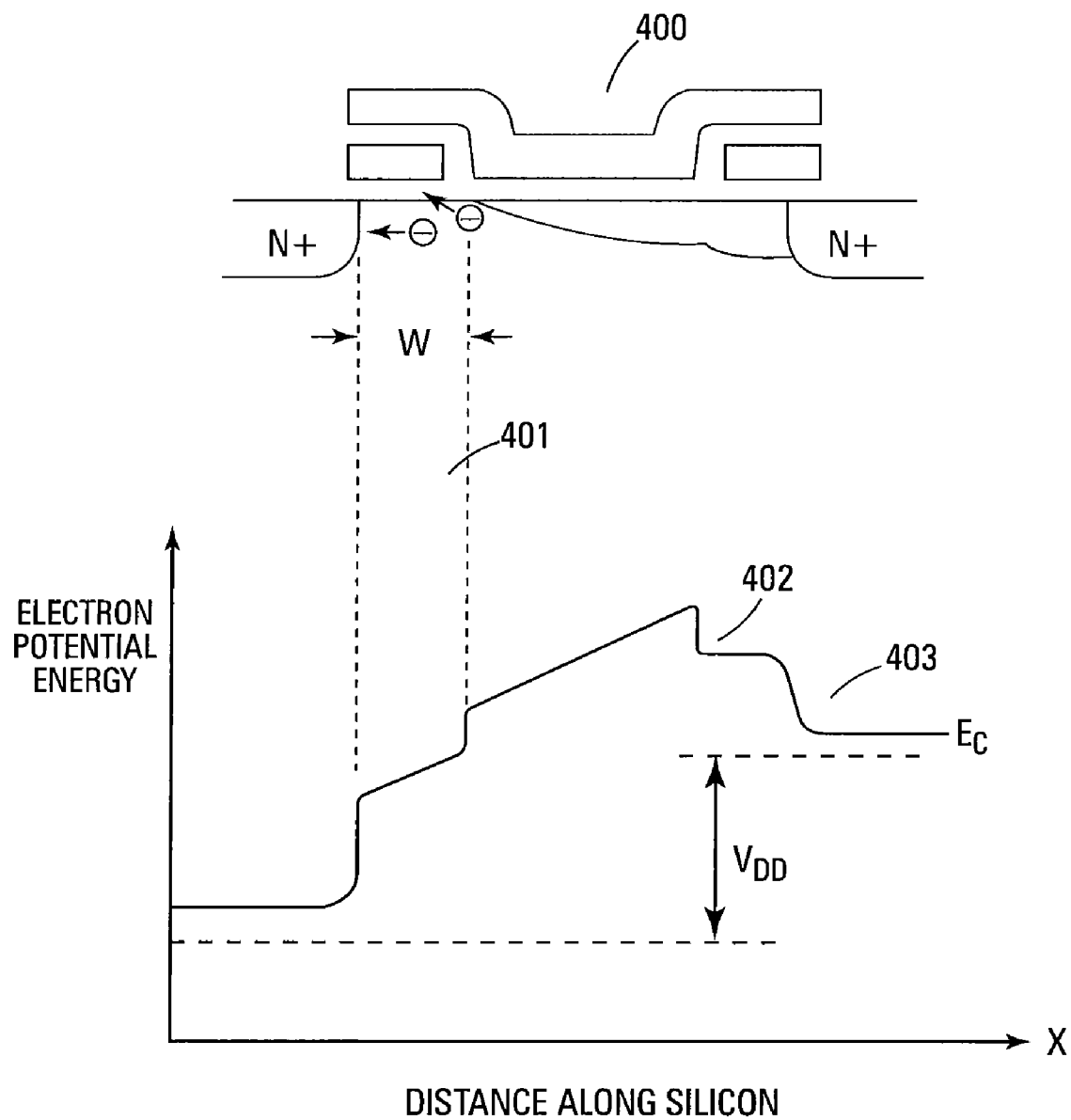
FIG. 4 shows a plot of one embodiment of the potential energy for electrons along the surface of the embodiment of FIG. 1.

FIG. 4 illustrates a plot of one embodiment of the potential energy for electrons along the surface of the planar NROM embodiment of FIG. 1. The plot for the vertical split nitride layer NROM embodiment is substantially similar and is not illustrated herein in the interest of brevity.

The plot of FIG. 4 shows that the electron potential energy increases as the distance increases from the drain of the transistor 400. The ballistic transport region 401 is indicated adjacent the drain region and is indicated as 10-40 nm wide. However, alternate embodiments may use different ballistic transport region widths, depending on the width of the nitride storage regions. The electron potential energy sharply drops at the second nitride storage region and drops further 403 in response to the source region.

Figure 5A:
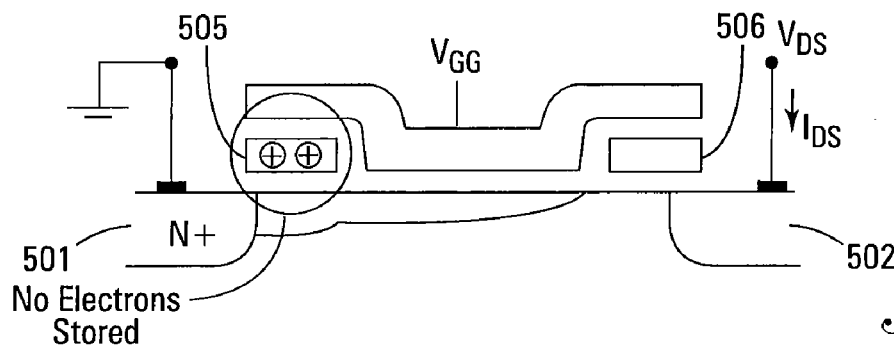
FIGS. 5A and 5B show a cross-sectional view of one embodiment of a read operation of the present invention in accordance with the embodiment of FIG. 1.
Figure 5B:
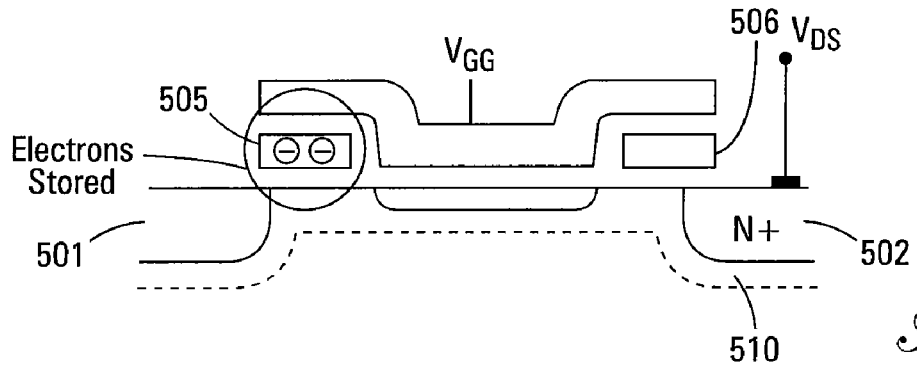

FIGS. 5A and 5B illustrate a read operation in one direction for the planar embodiment transistor of the present invention. Referring to FIG. 5A, the left side source/drain region 501 is grounded while the right side source/drain region 502 acts as a drain with a drain voltage applied ($V_{DS}$). A relatively smaller gate voltage ($V_{GG}$), near threshold, is applied to turn on the transistor. If there are no electrons stored on the left nitride storage region 505, the channel near the source region 501 turns on and the channel conducts such that drain current $I_{DS}$ flows.

FIG. 5B illustrates an embodiment where the left nitride storage region 505 has electrons stored such that the portion of the channel near the source region 501 does not turn on and the channel will not conduct. This results in no drain current flow. A large drain voltage is applied to fully deplete the nitride region 510 near the drain 502 so that the charge state of the nitride storage region 506 on the right side cannot determine the conductivity state of the cell.

Figure 6A:
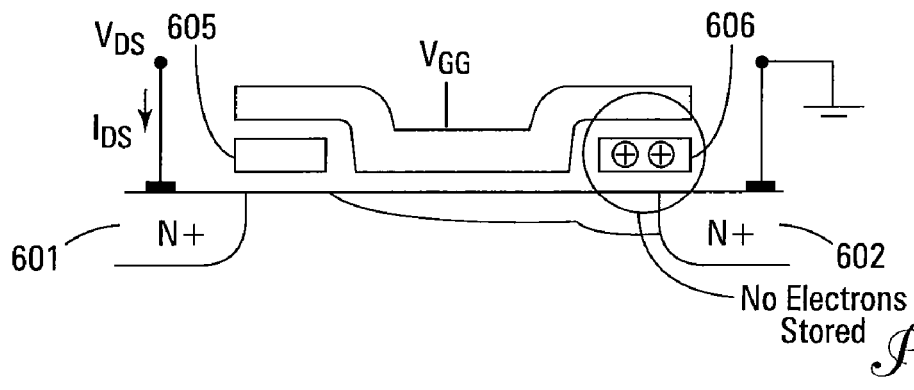
FIGS. 6A and 6B show a cross-sectional view of another embodiment of a read operation of the present invention in accordance with the embodiment of FIG. 1.
Figure 6B:
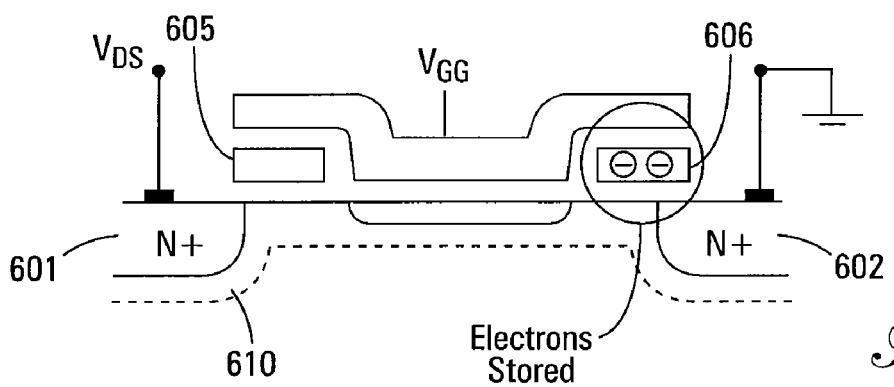

FIGS. 6A and 6B illustrate a read operation in the opposite direction than that illustrated in FIGS. 5A and 5B. In this embodiment, as illustrated in FIG. 6A, the right source/drain region 602 is grounded and a drain voltage is applied to the left source/drain region 601 that is now acting as the drain.

A relatively smaller gate voltage (e.g., near threshold) is applied in order to turn on the transistor. If no electrons are stored on the right nitride storage region 606, the portion of the channel near the source 602 turns on and the channel conducts. This results in a drain current $I_{DS}$ flow.

FIG. 6B illustrates an embodiment where the right nitride storage region 606 has stored electrons. In this embodiment, the channel near the source 602 does not turn on and the channel will not conduct. This results in no drain current flow. A large drain voltage, VDS, is applied to the drain 601 to fully deplete the region 610 near the drain 601 so that the charge state of the left nitride storage region 605 cannot determine the conductivity state of the cell.

FIGS. 7A-7D illustrate a cross-sectional view of one embodiment of a fabrication method of the present invention in accordance with the planar NROM embodiment of FIG. 1. The following fabrication methods in both FIGS. 7 and 8 refer to a p-type substrate and n-type conductivity doped regions. However, the present invention is not limited to this type of NROM transistor.

The fabrication method illustrated in FIG. 7A begins with a p-type conductivity silicon substrate 700 that is doped in a plurality of source/drain regions 701 and 702 to n-type conductivity material. Each transistor is comprised of a source region and a drain region where the orientation is determined by the direction of operation of the transistor.

The silicon is oxidized to form an oxide layer 705 on the surface of the substrate 700. A nitride layer 707 is deposited on top of the oxide layer 705. As discussed subsequently, portions of the nitride layer 707 eventually become the nitride storage regions.

A thick oxide mask 710 is deposited on top of the nitride layer 707 substantially between the n+ regions 701 and 702. A polysilicon layer is deposited and directionally etched to leave polysilicon sidewall areas 711 and 712 on either side of the oxide mask 710. In one embodiment, each polysilicon sidewall area is in a range of 10-40 nm wide. A sidewall process that is well known in the art is used to define these sublithographic dimensions in a 100 nm technology and etch the short nitride storage areas.

FIG. 7B shows that the oxide mask is removed to leave the polysilicon sidewall areas 711 and 712 that protect the areas in the nitride layer that are to become the nitride storage regions. FIG. 7C shows that the nitride layer is etched to leave the nitride areas 720 and 721. Another oxide layer 725 is then formed over the nitride areas 720 and 721.

FIG. 7D shows that a layer of polysilicon 730 is deposited over the upper oxide layer 725. The polysilicon layer 730 forms the control gate for the transistor. The virtual ground array configuration insures that all components of the device structure are self-aligned and that there are no critical alignment steps.

FIGS. 8A-8E show a cross-sectional view of one embodiment of a fabrication method of the present invention in accordance with the vertical, split nitride layer NROM embodiment of FIG. 2. The process begins with a silicon p-type substrate 800 on which an oxide layer 801 and a nitride layer 803 are formed as mask layers.

Figure 8A:
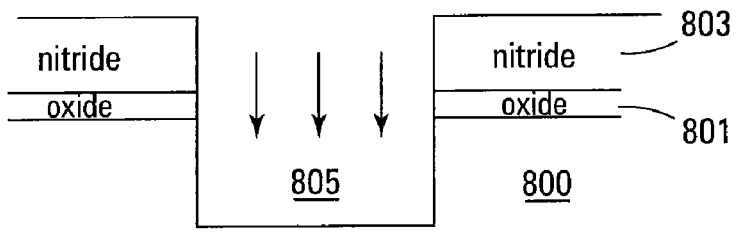
FIGS. 8A-8E show a cross-sectional view of one embodiment of a fabrication method of the present invention in accordance with the embodiment of FIG. 2.
Figure 8B:
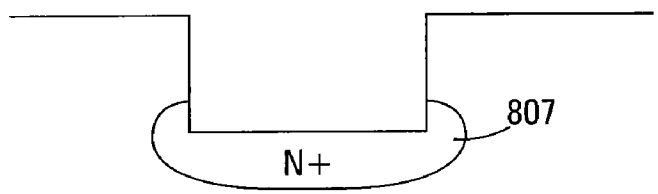
Figure 8C:
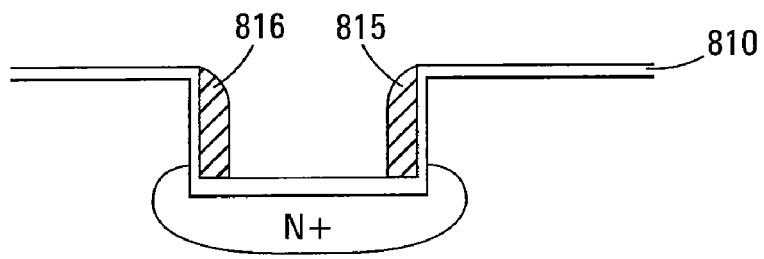

A trench 805 is then etched into the substrate and through the two mask layers 801 and 803. FIG. 8B shows that an n+ doped region 807 is implanted under the trench to act as a source/drain region 807. The mask 801 and 803 is removed and the source/drain region 807 is annealed. FIG. 8C shows that a layer of oxide 810 is deposited on the substrate and in the trench. A layer of nitride is deposited and the nitride storage areas 815 and 816 are formed by a sidewall process and direction etching of the deposited nitride layer. The length of the nitride storage areas 815 and 816 is defined by the depth of the trench and by the use of the sidewall process. The sidewall process is well known in the art and is not discussed further.

Figure 8D:
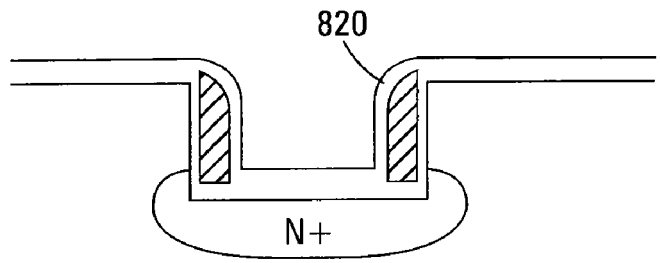
Figure 8E:
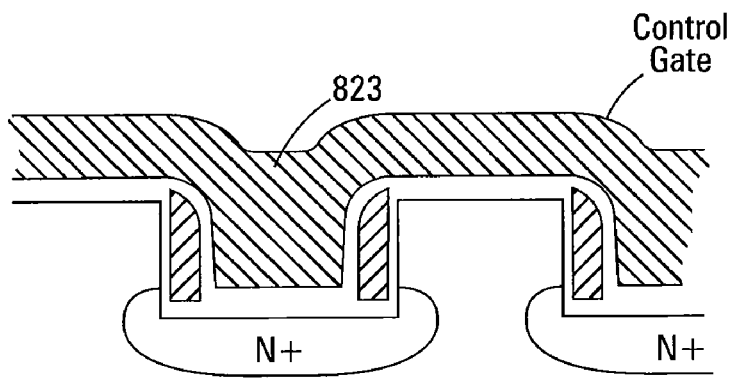

FIG. 8D shows an oxide layer 820 is deposited on top of the nitride areas in the trench and over the oxide layer outside the trench. FIG. 8E illustrates the deposition of a polysilicon layer 823 that acts as the control gate for the transistor.

While the fabrication methods illustrated in FIGS. 7 and 8 focus on only one flash transistor, it is well known in the art that this fabrication method is used to fabricate millions of transistors on an integrated circuit.

Figure 9:
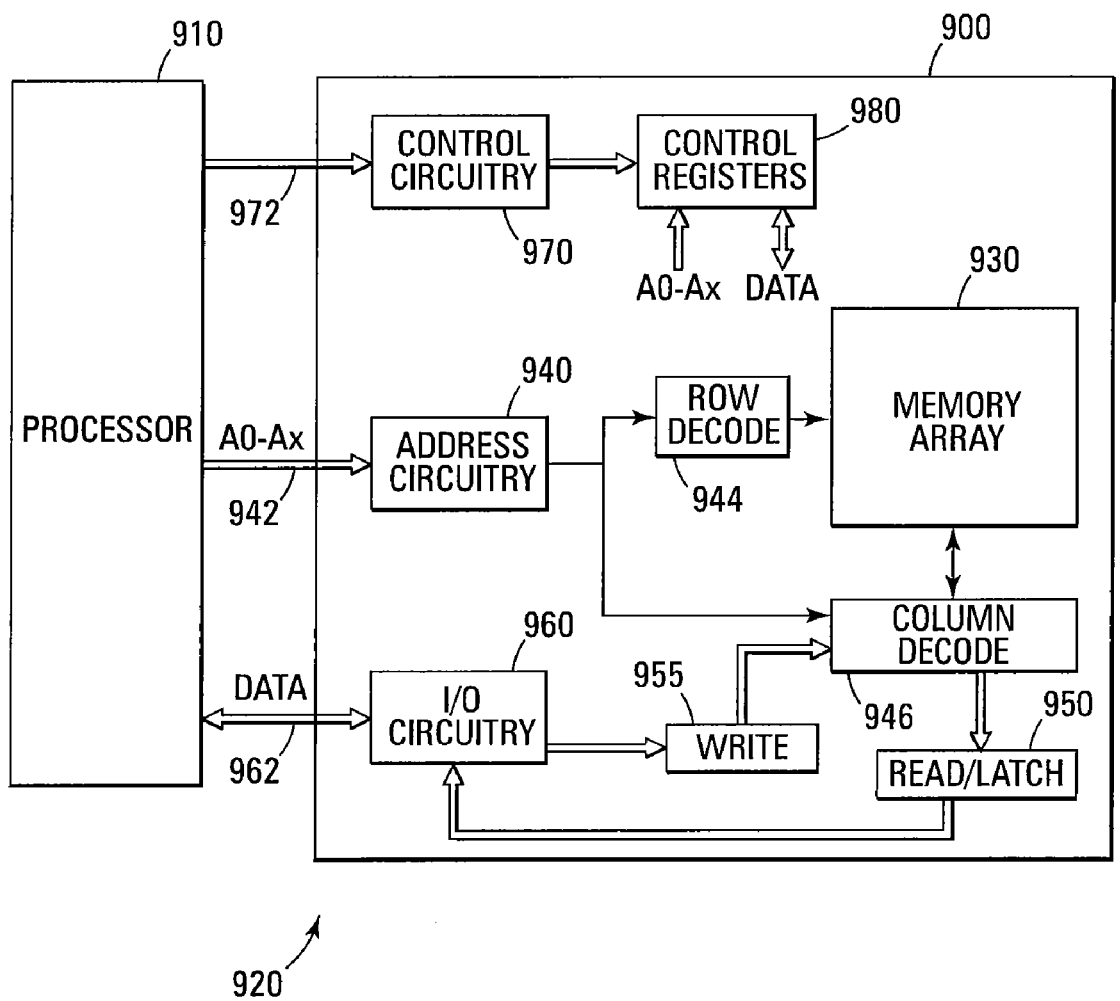
FIG. 9 shows a block diagram of an electronic system of the present invention.

FIG. 9 illustrates a functional block diagram of a memory device 900 that can incorporate the flash memory cells of the present invention. The memory device 900 is coupled to a processor 910. The processor 910 may be a microprocessor or some other type of controlling circuitry. The memory device 900 and the processor 910 form part of an electronic system 920. The memory device 900 has been simplified to focus on features of the memory that are helpful in understanding the present invention.

The memory device includes an array of flash memory cells 930 that can be NROM flash memory cells. The memory array 930 is arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture or a NOR architecture. The memory cells of the present invention can be arranged in either a NAND or NOR architecture as well as other architectures.

An address buffer circuit 940 is provided to latch address signals provided on address input connections A0-Ax 942. Address signals are received and decoded by a row decoder 944 and a column decoder 946 to access the memory array 930. It will be appreciated by those skilled in the art, with the benefit of the present description, that the number of address input connections depends on the density and architecture of the memory array 930. That is, the number of addresses increases with both increased memory cell counts and increased bank and block counts.

The memory device 900 reads data in the memory array 930 by sensing voltage or current changes in the memory array columns using sense/buffer circuitry 950. The sense/buffer circuitry, in one embodiment, is coupled to read and latch a row of data from the memory array 930. Data input and output buffer circuitry 960 is included for bi-directional data communication over a plurality of data connections 962 with the controller 910. Write circuitry 955 is provided to write data to the memory array.

Control circuitry 970 decodes signals provided on control connections 972 from the processor 910. These signals are used to control the operations on the memory array 930, including data read, data write, and erase operations. The control circuitry 970 may be a state machine, a sequencer, or some other type of controller.

The flash memory device illustrated in FIG. 9 has been simplified to facilitate a basic understanding of the features of the memory. A more detailed understanding of internal circuitry and functions of flash memories are known to those skilled in the art.

CONCLUSION

In summary, a planar NROM flash memory device uses a combination of very short split nitride charge storage regions to accelerate electrons near a drain region during a write operation. In one embodiment, the nitride storage regions are 10-40 nm in length. Using the ballistic direction injection, electrons can be accelerated over a short distance and easily overcome the silicon-oxide interface potential barrier and be injected onto the nitride storage regions. A negative substrate bias may be used to enhance the write operation.

In the case of NROM flash memory devices where at least part of the channel is vertical, the geometry is more favorable for ballistic transport electrons being incident on the silicon-oxide interface and being directly injected over this barrier onto the nitride storage regions. These electrons will not undergo collisions with the lattice atoms. Write currents and times will be lower using the ballistic direction injection. Substrate bias may be implemented to enhance the write operation.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. An NROM flash memory cell comprising:
   a substrate having a pair of source/drain regions, the pair of source/drain regions being linked by a channel in the substrate, the channel comprising a vertical section and a planar section;
   a first and a second nitride storage element each located over the channel, the first and the second nitride storage elements being separated from each other, the first nitride charge storage element establishing a virtual source/drain region in the channel; and
   a control gate formed over the first and the second separated nitride charge storage elements and the control gate further comprising a section formed between the first and the second nitride storage elements such that the depression electrically isolates the pair of nitride storage elements.

2. The NROM flash memory cell of claim 1, and further comprising a substrate bias connection that is capable of applying a bias to the substrate.

3. The NROM flash memory cell of claim 2 wherein the bias is in a range of −1 V to −2 V.

4. The NROM flash memory cell of claim 1 wherein the virtual source/drain region is established in response to an absence of electrons on the nitride charge storage region.

5. The NROM flash memory cell of claim 1 wherein the substrate is a p-type silicon material and the doped regions are an n-type silicon material.

6. A non-volatile memory cell array, comprising:
   a plurality of non-volatile memory cells coupled together through wordlines and bitlines, each cell comprising:
   a substrate having a pair of source/drain regions, the pair of source/drain regions being linked by a channel in the substrate, the channel comprising a vertical section and a planar section;
   a first and a second nitride storage element each located over the channel, the first and the second nitride storage elements being separated from each other, the first nitride charge storage element establishing a virtual source/drain region in the channel; and
   a control gate formed over the first and the second separated nitride charge storage elements and the control gate further comprising a section formed between the first and the second nitride storage elements such that the depression electrically isolates the pair of nitride storage elements.

7. The non-volatile memory cell array of claim 6, and further comprising a substrate bias connection that is capable of applying a bias to the substrate.

8. The non-volatile memory cell array of claim 7 wherein the bias is in a range of −1 V to −2 V.

9. The non-volatile memory cell array of claim 6 wherein the virtual source/drain region is established in response to an absence of electrons on the nitride charge storage region.

10. The non-volatile memory cell array of claim 6 wherein the substrate is a p-type silicon material and the doped regions are an n-type silicon material.

11. An electronic system comprising:
    a processor that generates memory control signals; and
    an NROM non-volatile memory cell array coupled to the processor and comprising a plurality of NROM non-volatile memory cells coupled together through wordlines and bitlines, each cell comprising:
    a substrate having a pair of source/drain regions, the pair of source/drain regions being linked by a channel in the substrate, the channel comprising a vertical section and a planar section;

first and a second nitride storage element each located over the channel, the first and the second nitride storage elements being separated from each other, the first nitride charge storage element establishing a virtual source/drain region in the channel; and a control gate formed over the first and the second separated nitride charge storage elements and the control gate further comprising a section formed between the first and the second nitride storage elements such that the depression electrically isolates the pair of nitride storage elements.

12. A method of fabricating a non-volatile memory cell, comprising:

doping a substrate with a plurality of source/drain regions;
forming an oxide layer on a surface of the substrate;
depositing a nitride layer on the oxide layer;
etching the nitride layer to form a plurality of separated nitride storage elements;
forming a second oxide over the separated nitride storage elements, the second oxide layer having a depression therein between the separated nitride storage elements; and
depositing a control gate over the second oxide layer, the control gate having a section deposited between the separated nitride storage elements to electrically isolate the nitride storage elements.

13. The method of claim 12, wherein the source/drain regions are formed to create a channel therebetween, the channel being two dimensional and comprising a vertical section and a planar section.

14. A method of programming a non-volatile memory cell comprising a plurality of nitride charge storage regions located between a substrate having two source/drain regions and a control gate, the two source/drain regions linked by a channel region in the substrate, the channel region having both a vertical and a horizontal portion, the method comprising:

applying a drain bias to one of the source/drain regions to cause the channel region nearest the drain to pinch off;
biasing the control gate; and
biasing the second source/drain region to accelerate hot electrons in a narrow virtual source/drain region near the drain to inject the hot electrons directly onto the nitride storage region nearest the drain.

15. The method of claim 14, and further comprising applying a bias to the substrate.

16. The method of claim 15, wherein applying a bias to the substrate comprises applying a bias in a range of −1 V to −2 V.

17. A method of ballistic direction injection in a non-volatile memory cell having a pair of source/drain regions linked by a channel in a substrate, the channel having a vertical section and a planar section, a pair of nitride storage elements located over the channel and separated from each other, the first nitride charge storage element establishing a virtual source/drain region in the channel, and a control gate over the nitride storage elements having a section formed between nitride storage elements to electrically isolate the pair of nitride storage elements, the method comprising:

over-erasing the cell to leave the separated nitride storage regions with an absence of electrons;
applying a drain voltage to one of the source/drain regions to pinch off the channel away from the drain region by causing a high density of electrons near the other of the source/drain regions; and
injecting hot electrons directly onto the nitride storage region near the drain.

18. The method of claim 17, wherein the pinched-off region is pinched off in a range of approximately 10-40 nanometers.

19. The method of claim 17, and further comprising applying a bias to the substrate.

20. The method of claim 19, wherein applying a bias to the substrate comprises applying a bias in a range of −1 V to −2 V.

* * * * *

UNITED STATES PATENT AND TRADEMARK OFFICE
CERTIFICATE OF CORRECTION

| | |
|---|---|
| PATENT NO. | : 7,480,185 B2 |
| APPLICATION NO. | : 11/691603 |
| DATED | : January 20, 2009 |
| INVENTOR(S) | : Forbes |

Page 1 of 1

It is certified that error appears in the above-identified patent and that said Letters Patent is hereby corrected as shown below:

In column 9, line 1, in Claim 11, before "first" insert -- a --.

Signed and Sealed this

Fourteenth Day of April, 2009

JOHN DOLL
*Acting Director of the United States Patent and Trademark Office*